United States Patent
Ali et al.

(10) Patent No.: US 8,471,741 B2
(45) Date of Patent: Jun. 25, 2013

(54) METHOD AND DEVICE FOR REDUCING INTER-CHANNEL COUPLING IN INTERLEAVED AND MULTI-CHANNEL ADCS

(75) Inventors: Ahmed Mohamed Abdelatty Ali, Oak Ridge, NC (US); Huseyin Dinc, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 8 days.

(21) Appl. No.: 13/348,795

(22) Filed: Jan. 12, 2012

(65) Prior Publication Data

US 2013/0120172 A1     May 16, 2013

Related U.S. Application Data

(60) Provisional application No. 61/559,361, filed on Nov. 14, 2011.

(51) Int. Cl.
 *H03M 1/20*     (2006.01)
(52) U.S. Cl.
 USPC ............ 341/131; 341/118; 341/120; 341/155
(58) Field of Classification Search
 USPC .................................. 341/118, 120, 131, 155
 See application file for complete search history.

(56) References Cited

U.S. PATENT DOCUMENTS

| | | | | |
|---|---|---|---|---|
| 5,073,777 A * | 12/1991 | Fukuhara et al. | ............. | 341/131 |
| 5,887,032 A | 3/1999 | Cioffi et al. | | |
| 6,154,158 A * | 11/2000 | Walker | ............. | 341/118 |
| 6,278,391 B1 * | 8/2001 | Walker | ............. | 341/118 |
| 6,483,617 B1 | 11/2002 | Roberts | | |
| 6,653,959 B1 * | 11/2003 | Song | ............. | 341/131 |
| 6,901,108 B2 * | 5/2005 | Blodgett et al. | ............. | 375/232 |
| 6,975,255 B1 * | 12/2005 | Zhang | ............. | 341/131 |
| 7,064,698 B2 * | 6/2006 | Locher et al. | ............. | 341/143 |
| 7,317,413 B2 * | 1/2008 | Lee | ............. | 341/144 |
| 7,362,250 B2 * | 4/2008 | Weibiao et al. | ............. | 341/143 |
| 7,420,494 B1 * | 9/2008 | Schreier | ............. | 341/143 |
| 7,778,320 B2 | 8/2010 | Agazzi et al. | | |
| 7,786,910 B2 | 8/2010 | Ali et al. | | |
| 7,809,070 B2 | 10/2010 | Ashikhmin et al. | | |
| 2010/0039923 A1 | 2/2010 | Kim et al. | | |
| 2010/0309774 A1 | 12/2010 | Astrom et al. | | |
| 2011/0236028 A1 | 9/2011 | Liu et al. | | |

OTHER PUBLICATIONS

PCT International Search Report and Written Opinion from PCT/US2012/054216, mailed on Nov. 16, 2012.

* cited by examiner

*Primary Examiner* — Linh Nguyen
(74) *Attorney, Agent, or Firm* — Kenyon & Kenyon LLP

(57) ABSTRACT

A method and a corresponding device for reducing inter-channel coupling in a circuit having a plurality of channels includes injecting a randomly determined amount of dither into a first channel of a circuit having a plurality of channels, and after injecting the dither, obtaining an output signal of a second channel in the plurality of channels. A correlation value indicating a degree of correlation between the injected dither and the output signal is determined, and an amount of charge applied to the second channel due to cross-coupling with the first channel is reduced. The amount of the reduction is calculated as a function of the correlation value.

20 Claims, 3 Drawing Sheets

METHOD AND DEVICE FOR REDUCING INTER-CHANNEL COUPLING IN INTERLEAVED AND MULTI-CHANNEL ADCS

CROSS-REFERENCE TO RELATED APPLICATIONS

This application claims the benefit, under 35 U.S.C. §119 (e), of U.S. Provisional Patent Application No. 61/559,361, filed Nov. 14, 2011, the content of which is hereby incorporated by reference in its entirety.

BACKGROUND INFORMATION

Analog-to-digital converters (ADCs) often include a plurality of input/output paths (channels) in which input signals are processed to produce corresponding output signals. Interleaved and multi-channel ADCs are prone to performance degradation due to cross-coupling between channels. Causes of performance degradation include kick-back and memory effects, both of which can be more severe compared to single-channel ADCs.

FIG. 1 shows a block diagram of a conventional multi-channel pipelined ADC. For illustration purposes, only two channels are shown. However, it will be understood that any plurality of channels may exist. A first channel 105 and a second channel 205 may be identical with respect to the structure and interconnections between respective stages in each channel. Each channel may include any number of pipelined stages. In a multi-channel ADC, each channel may operate independently. For example, channel 105 may sample and convert a first data signal while channel 205 samples and converts a second data signal. In an interleaved ADC, the channels may sample the same data signal in an alternating fashion and the outputs of all channels may be combined to provide a higher effective sampling rate compared to sampling the data signal using a single channel.

In the channel 105, three stages 100/110/120 are connected in succession so that the output of one stage may serve as the input of the next stage. For illustration purposes, only the first two stages and the final (Nth) stage are shown. However, any number of stages can be connected in this fashion. The first stage 100 is shown in detail and is connected to an analog input voltage Vin and includes an ADC 10 (also known as a "flash") and a multiplying digital-to-analog converter (MDAC) 50. The MDAC 50 includes a digital-to-analog converter (DAC) 20 and an amplifier 30. Vin is input to the ADC 10 to generate a digital input to the DAC 20, which in turn converts the digital output of the ADC 10 back into an analog signal. The analog output of the DAC 20 is then subtracted from Vin to obtain a residue signal, which is then input to the amplifier 30 to generate an analog output voltage VO as input to the next stage, i.e., stage 110. The stages 100/110/120 may include similar components, with the analog output of one stage going into the input of the next stage in order to perform an analog-to-digital conversion of Vin. However, the final stage, i.e., stage 120, may not include a DAC or amplifier since the final output of the ADC is a digital signal that can be generated, for example, directly from the output of the ADC 10.

In a single-channel ADC, a set of capacitors may be charged by an input signal source during a sample phase, then switched to being connected to a reference voltage source during a hold (amplify) phase. When the capacitors are switched back to the input signal source during the next sample phase, residual charge stored on the capacitors can become superimposed onto the value of the input signal source in this sample phase. Part of this "kick-back" can be sampled by the input network at the end of this sampling phase. The kick-back is non-linear in that the amount of charge injected back into the ADC is not a linear function of the value of the input. Thus, it is not possible to correct for the kick-back using only the input value, e.g., by scaling the input value.

Kick-back can also have adverse effects in a multi-channel or interleaved setting, leading to performance degradation in both signal-to-noise ratio (SNR) and spurious free dynamic range (SFDR), as well as degradation in small signal linearity because of integral nonlinearity (INL) jumps. Two types of kick-back can occur due to cross-coupling. The first type is kick-back due to the input signal sampled on one channel's capacitances being transferred onto sampling capacitances of another channel. The second type is kick-back due to the charges on the capacitors of the DAC 20 being transferred to the sampling capacitors of another channel. This may occur, for example, when the capacitors in the DAC 20 are also used as sampling capacitors for the other channel and are not reset before sampling by the other channel.

In addition to the sharing of DAC capacitors, the sharing of components, such as amplifiers and capacitors, in other locations along the channels may also produce coupling. For example, the amplifier 30 may be shared between the first stage 100 in the channel 105 and the first stage 200 of the channel 205. In another example, a feedback capacitor in the amplifier 30 of the first stage 100 in the first channel 105 may be shared with an amplifier of the first stage 200 in the second channel 205. This is possible because usage of the shared components is alternated between channels. Thus, the channels 105/205 may be coupled via the shared components so that, in addition to the kick-back effects described above, a memory effect is produced in which the previous sample in one channel contaminates the current sample of another channel, leading to inter-stage errors that reduce SNR, SFDR and small signal linearity.

In an interleaved ADC, cross-coupling effects may limit the number of interleavable channels to no more than two. With two interleaved channels, the channels perform sampling during alternating clock cyles, so that no overlapping samples occur. However, with three or more interleaved channels, samples may overlap, causing glitching (e.g., kick-back) to occur during sampling. Thus, operation may be required to be restricted so that no channel switching occurs while the input is being sampled on any particular channel.

In a multi-channel ADC, components are not usually shared. However, inter-channel cross-coupling may still occur through other coupling mechanisms. For example, cross-coupling can occur when channels are located on the same substrate or circuit board, are connected to common reference signals such as ground, or located within close proximity to each other. Although cross-coupling effects are not as severe compared to interleaved ADCs (since the outputs of the channels are usually independent), performance can still be noticeably affected.

SUMMARY

Example embodiments of the present invention provide for a reduction in coupling between channels of a circuit having a plurality of channels.

An example embodiment of the present invention is directed to a method that includes injecting a randomly determined amount of dither into a first channel of a circuit having a plurality of channels, and after injecting the dither, obtaining an output signal of a second channel in the plurality of channels. The method further includes determining a correlation value indicating a degree of correlation between the injected dither and the output signal, and reducing an amount of charge applied to the second channel due to cross-coupling with the first channel, wherein an amount of the reduction is calculated as a function of the correlation value.

An example embodiment of the present invention is directed to a device that includes an injection circuit, a detection circuit, a correlation circuit and a correction circuit. The injection circuit injects a randomly determined amount of dither into a first channel of a circuit having a plurality of channels. The detection circuit, after the dither is injected, obtains an output signal of a second channel in the plurality of channels. The correlation circuit determines a correlation value indicating a degree of correlation between the injected dither and the output signal. The correction circuit reduces an amount of charge applied to the second channel due to cross-coupling with the first channel, wherein an amount of the reduction is calculated as a function of the correlation value.

DETAILED DESCRIPTION OF EXAMPLE EMBODIMENTS

The present invention relates to systems and methods for kick-back and memory reduction in circuits having a plurality of channels.

Figure 1:
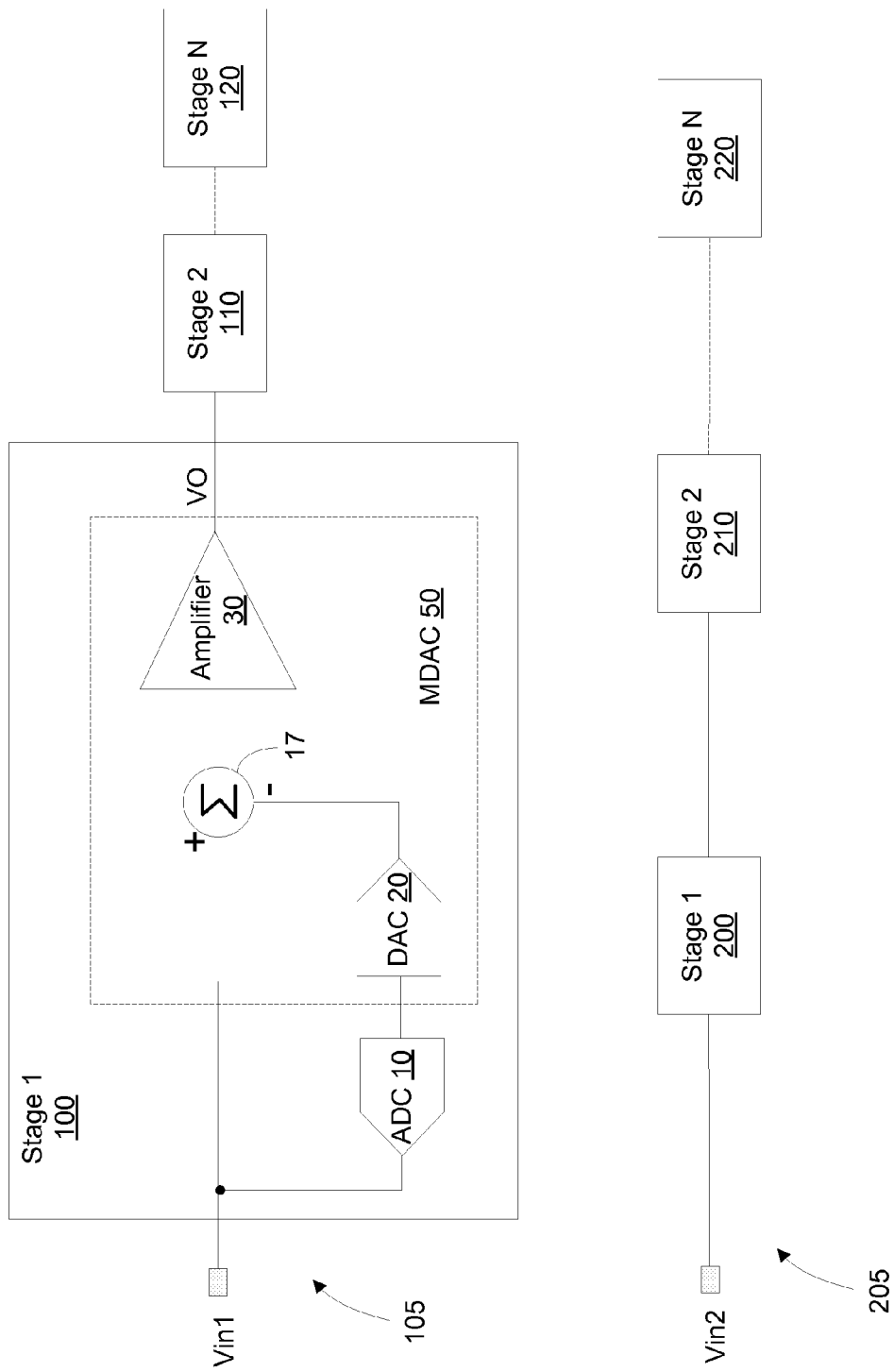
FIG. 1 shows a block diagram of a conventional pipelined ADC.
Figure 2:
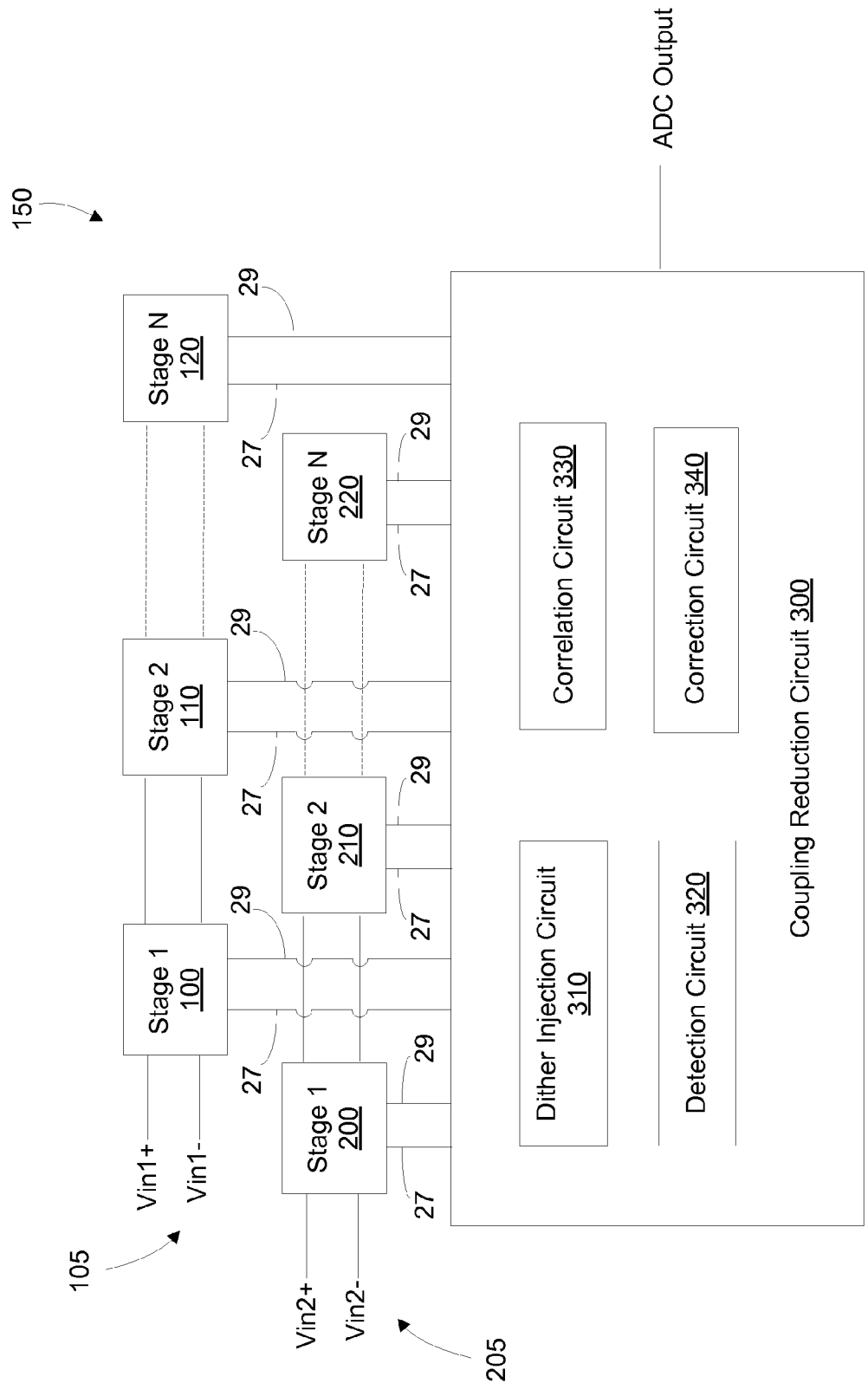
FIG. 2 shows an exemplary system for coupling reduction according to the present invention.

FIG. 2 shows an exemplary system 150 according to the present invention. The system 150 may include the channels 105/205 as described above, in addition to a coupling reduction circuit 300. The reduction circuit 300 may include a dither injection circuit 310, a detection circuit 320, a correlation circuit 330, and a correction circuit 340.

The dither injection circuit 310 may include a circuit arrangement for generating and injecting dither into one or more locations in each channel. In one embodiment, the reduction circuit 300 may include connections 27 for injecting the dither as an analog voltage signal into a selected location in each stage of each channel 105/205. The dither may be generated as a random voltage within a predetermined voltage range, and applied to a suitable injection location in each stage, as explained below. Any method of generating and applying a predetermined voltage may be used for providing the dither. For example, a pseudo-random digital number may be used for generating the dither voltage using a switched capacitor network. The dither may then be injected via one or more capacitors connected in parallel with sampling capacitors in each stage (e.g., in sampling capacitors located in each DAC 20). Other injection methods are also possible.

The coupling reduction circuit 300 may include circuitry for processing the digital bits generated by the pipeline. The pipeline generates bits from the different stages, and by properly combining those bits using appropriate circuitry, a digital representation can be constructed for the analog signal at any point in the pipeline. Thus, the circuit 300 may include a circuit arrangement for receiving an overall output of each channel 105/205 (e.g., the output of the final stage) and/or an output of each stage (e.g., the analog voltage VO that is produced by each stage except the final stage). In one embodiment, the reduction circuit 300 may include connections 29 for detecting the digital output of each stage. The output from each stage may be combined, e.g., using a constructor circuit, to generate a single digital number representing the output of each channel 105/205, i.e., a digitized version of the analog input Vin1 or Vin2. In this manner, the circuit 300 may obtain both the overall channel output and the individual VO outputs. Since all ADCs provide digital output, additional detection circuitry may not be required, e.g., the detection circuit 320 may include pre-existing hardware.

In an alternative embodiment, the circuitry for processing the digital bits generated by the pipeline, e.g., the constructor circuit, may be located outside the circuit 300. Conventional ADCs often include constructor circuits, which may readily be adapted for use with a coupling reduction circuit according to an embodiment of the present invention.

The correlation circuit 330 may receive the output of each channel from the detection circuit 320 and correlate the dither to the output. The correlation may be performed using any statistical correlation technique. In one embodiment, the correlation technique used is least mean squares (LMS). Applying an LMS algorithm, the correlation circuit 330 may determine a gain coefficient GC (alternatively referred to herein as a coupling coefficient) indicative of a level of correlation (e.g., due to coupling) between the injected dither and the channel output.

The correction circuit 340 may include circuitry for modifying the channel output to reduce coupling effects. The correction circuit 340 may include a memory for storing correction values that correct for the coupling effects as well as effects resulting from the dither injection itself. For example, a first correction value may correspond to the kickback caused by injecting the dither, while a second correction value may correspond to the kickback caused by the input signal from the previous sample. The correction circuit 360 may be implemented as a digital subtractor that subtracts the correction values from the output of a channel that is selected for correction.

Figure 3:
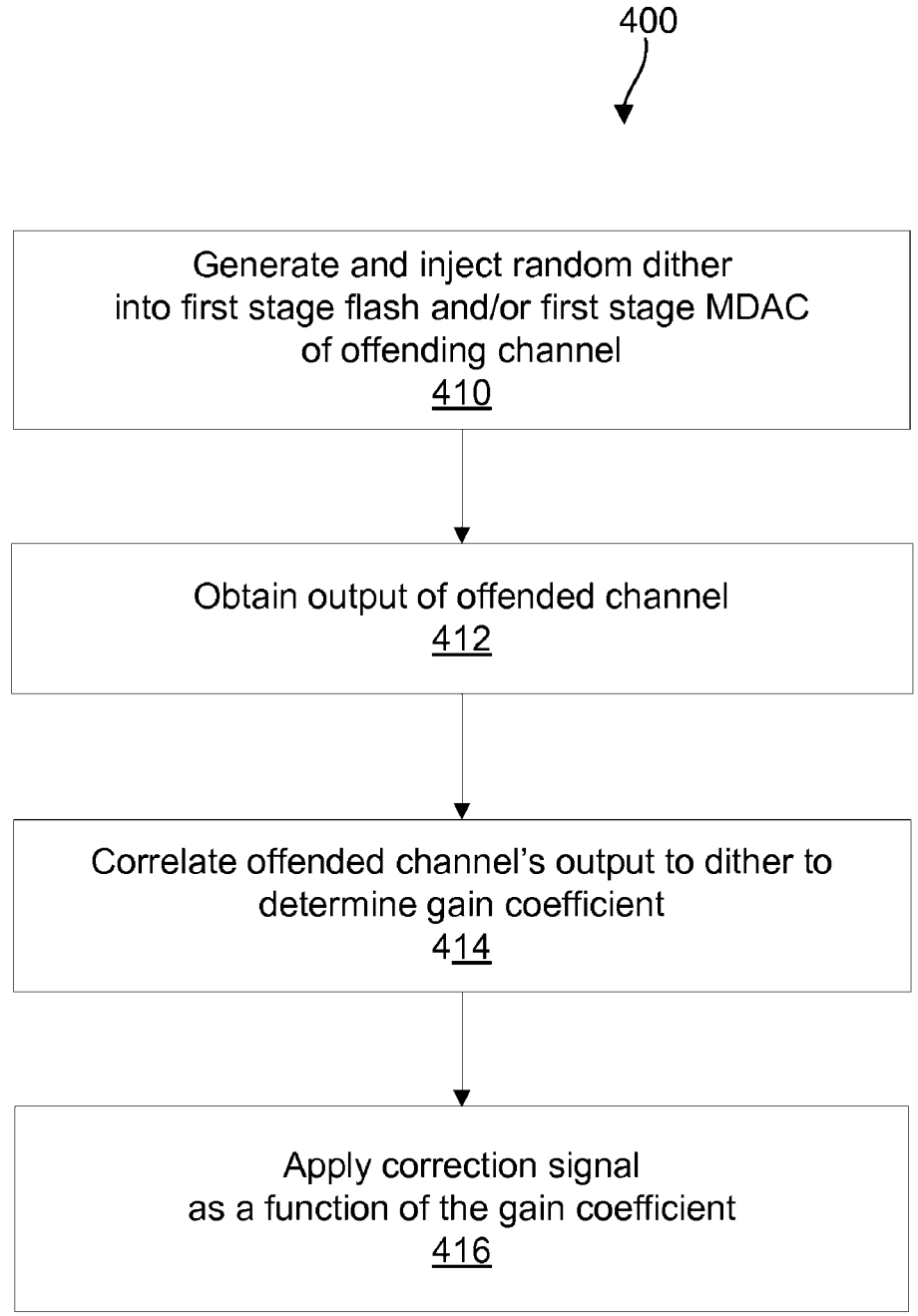
FIG. 3 shows an exemplary method for coupling reduction according to the present invention.

An exemplary method 400 for reducing coupling effects will now be described with reference to FIG. 3. The method 400 may begin at step 410, where the dither is generated and injected. According to exemplary embodiments of the present invention, kick-back in interleaved and multi-channel ADCs is reduced by injecting dither into a suitable location that corresponds to the location in an offending channel, then detecting the dither at a location in an offended channel. For example, dither can be injected in the first stage flash (e.g., ADC 10) or in both the first stage flash and the first stage MDAC (e.g., the input to DAC 20). When dither is injected in both the MDAC and flash, the dither values may, but need not be of similar value. For instance, while the dither values need not be identical, it may be advantageous to select dither values that are within a particular range of each other. When dither is injected in only one of the MDAC and the flash, it measures the gain of the MDAC amp (i.e., inter-stage gain). If it is injected in both the MDAC and flash, it measures the gain of the whole stage (or ADC) when input referred, not just the gain of the MDAC amp. Therefore, coupling that results in inter-stage gain errors may be reduced by injecting the dither into the MDAC or the flash, but not both. On the other hand, coupling that appears as an overall gain error (i.e., an error in the input) may be reduced by injecting the dither into both the MDAC and the flash.

The dither may be injected in the form of a randomly determined voltage Vd, which is superposed onto existing voltages at the offending location(s). Then, the effects of the injected dither may be detected at the output of another channel (e.g., at the output of the channel 205). The roles of "offending" channel and "offended" channel may be alternated, so that each channel has an opportunity to be selected for correction of cross-coupling effects originating from that particular channel. In one embodiment, one channel is selected to be the offender and each additional channel is selected in turn to be the offended. Once all of the additional channels have been selected and tested, a different channel is selected to be the next offender and the testing repeated until each channel has been analyzed from the perspective of being both offender and offended.

In step 412, the output of the offended channel may be obtained. The output may be obtained using the detection circuit 320.

In step 414, the offended channel's output may be correlated to the dither to determine the gain coefficient. When the reduction circuit 300 is configured to correct for kick-back effects, the correlation may be performed using an LMS algorithm as follows:

$$Gc(A,B)_{n+1} = Gc(A,B)_n - \mu * Vd(B) * [Vd(B) * Gc(A,B)_n - Vin(A)],$$

where μ is an LMS step-size constant, Vd(B) is the dither injected in channel B, Vin(A) is the overall output of channel A (i.e., the digitized version of the analog input signal Vin that is input to the first stage in channel A), and Gc(A, B) is the gain coefficient from channel B (the offender) to channel A (the offended), taking into account that, when the ADC is interleaved, the sample on channel B may be shifted in time (e.g., existing in a previous clock cycle) relative to the signal at the output of channel A. In other words, Vin(A) is obtained at a time corresponding to when the cross-coupling effects of Vd(B) are expected to be observable at the offended location in channel A. When dither is injected in only one location (e.g., the MDAC or the flash), Vd(B) is equal to the digital value of the voltage applied at that location. When dither is injected in more than one location, Vd(B) is equal to the digital sum of all the applied voltages.

When the reduction circuit 300 is configured to correct for memory effects, the correlation may be performed using an LMS algorithm as follows:

$$Ge(A,B)_{n+1} = Ge(A,B)_n - \mu * Vd(B) * [Vd(B) * Ge(A,B)_n - VO(A)],$$

Where VO(A) is the digital value of the VO output of a particular stage corresponding to the offended location in channel A, Vd(B) is the digital value of the dither injected into channel B at a location of the shared component (e.g., the same stage as that from which VO(A) is obtained), and Ge(A, B) is the gain coefficient from channel B to channel A at the output of the stage where VO(A) is obtained, taking into account that, when the ADC is interleaved, the sample on channel B may be shifted in time relative to the signal at the output of the corresponding stage in channel A.

In 416, a correction signal is applied to the offended channel as a function of the gain coefficient determined in step 414. As mentioned above, the correction signal may include a component corresponding to coupling effects due to the injected dither, as well as a component corresponding to coupling effects due to input sampling.

In the preceding specification, the present invention has been described with reference to specific example embodiments thereof. It will, however, be evident that various modifications and changes may be made thereunto without departing from the broader spirit and scope of the present invention as set forth in the claims that follow. For example, dither may be injected in any particular circuit location and its effects detected at any other circuit location in order to capture the coupling coefficient between those two locations. Therefore, although the present invention has been described in connection with interleaved and multi-channel ADCs, the various embodiments may be adapted for reducing coupling in any circuit having a plurality of channels. Moreover, any coupling between any two locations can be reduced. Additionally, correlation may correct for higher order effects by substituting higher order terms (e.g., $Vd^2$, $Vd^3$, $Vd^4$, etc.) for Vd. The embodiments described herein may be presented combined with each other in various combinations. The specification and drawings are accordingly to be regarded in an illustrative rather than restrictive sense.

What is claimed is:

1. A method, comprising:
    injecting a randomly determined amount of dither into a first channel of a circuit having a plurality of channels;
    after injecting the dither, obtaining an output signal of a second channel in the plurality of channels;
    determining a correlation value indicating a degree of correlation between the injected dither and the output signal; and
    reducing an amount of charge applied to the second channel due to cross-coupling with the first channel, wherein an amount of the reduction is calculated as a function of the correlation value.

2. The method of claim 1, wherein the dither is injected as a function of a randomly generated digital number.

3. The method of claim 1, wherein the dither is injected by superposing a randomly generated voltage onto an existing voltage signal in the first channel.

4. The method of claim 1, wherein the amount of the reduction is calculated using two components:
    an amount of charge applied by sampling of an input signal at the first channel; and
    an amount of charge applied by the injection of the dither.

5. The method of claim 1, wherein:
    each channel is a multi-stage pipeline in an analog-to-digital converter; and
    the dither is injected into at least one of a digital-to-analog converter (DAC) component in a selected stage of the first channel, and a flash component in the selected stage.

6. The method of claim 1, wherein:
    each channel is a multi-stage pipeline in an analog-to-digital converter;
    at least one component is shared between the first and the second channels; and
    the dither is injected into only one of a digital-to-analog converter (DAC) component in a selected stage of the first channel, and a flash component in the selected stage.

7. The method of claim 6, wherein the at least one component includes at least one of an amplifier and a sampling capacitor.

8. The method of claim 1, further comprising:
    repeating the steps of claim 1, while substituting a different channel in the plurality of channels for at least one of the first and the second channels.

9. The method of claim 8, wherein the repeating is continued until each channel in the plurality of channels has been selected for injection as well as for reduction.

10. The method of claim 1, wherein the correlation value is determined using a least means square (LMS) algorithm in which second-order or higher terms of the dither are correlated to the output signal.

11. A device, comprising:
- an injection circuit that injects a randomly determined amount of dither into a first channel of a circuit having a plurality of channels;
- a detection circuit that, after the dither is injected, obtains an output signal of a second channel in the plurality of channels;
- a correlation circuit that determines a correlation value indicating a degree of correlation between the injected dither and the output signal; and
- a correction circuit that reduces an amount of charge applied to the second channel due to cross-coupling with the first channel, wherein an amount of the reduction is calculated as a function of the correlation value.

12. The device of claim 11, wherein the dither is injected as a function of a randomly generated digital number.

13. The device of claim 11, wherein the dither is injected by superposing a randomly generated voltage onto an existing voltage signal in the first channel.

14. The device of claim 11, wherein the amount of the reduction is calculated using two components:
- an amount of charge applied by sampling of an input signal at the first channel; and
- an amount of charge applied by the injection of the dither.

15. The device of claim 11, wherein:
- each channel is a multi-stage pipeline in an analog-to-digital converter; and
- the dither is injected into at least one of a digital-to-analog converter (DAC) component in a selected stage of the first channel, and a flash component in the selected stage.

16. The device of claim 11, wherein:
- each channel is a multi-stage pipeline in an analog-to-digital converter;
- at least one component is shared between the first and the second channels; and
- the dither is injected into only one of a digital-to-analog converter (DAC) component in a selected stage of the first channel, and a flash component in the selected stage.

17. The device of claim 16, wherein the at least one component is one of an amplifier and a sampling capacitor.

18. The device of claim 11, wherein:
- dither injection, obtaining of the output signal, determining of the correlation value, and reducing the amount of charge applied to the second channel are repeated, while substituting a different channel in the plurality of channels for at least one of the first and the second channels.

19. The device of claim 18, wherein the repeating is continued until each channel in the plurality of channels has been selected for injection as well as for reduction.

20. The device of claim 11, wherein the correlation value is determined using a least means square (LMS) algorithm in which second-order or higher terms of the dither are correlated to the output signal.

* * * * *